United States Patent
Matsuoka et al.

(10) Patent No.: US 7,681,159 B2
(45) Date of Patent: Mar. 16, 2010

(54) SYSTEM AND METHOD FOR DETECTING DEFECTS IN A SEMICONDUCTOR DURING MANUFACTURING THEREOF

(75) Inventors: Ryoichi Matsuoka, Yotsukaido (JP); Hidetoshi Morokuma, Hitachinaka (JP); Takumichi Sutani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 75 days.

(21) Appl. No.: 11/812,774

(22) Filed: Jun. 21, 2007

(65) Prior Publication Data
US 2008/0016481 A1 Jan. 17, 2008

(30) Foreign Application Priority Data
Jun. 23, 2006 (JP) .............................. 2006-174399

(51) Int. Cl.
*G06F 17/50* (2006.01)
(52) U.S. Cl. .................. 716/6; 716/4; 716/5; 382/144; 382/145; 438/14
(58) Field of Classification Search ................. 716/4–6; 382/144–145; 438/14
See application file for complete search history.

(56) References Cited

U.S. PATENT DOCUMENTS

| | | | | |
|---|---|---|---|---|
| 4,926,489 A | * | 5/1990 | Danielson et al. | 382/144 |
| 6,724,929 B1 | | 4/2004 | Matsuoka | |
| 6,778,695 B1 | * | 8/2004 | Schellenberg et al. | 382/144 |
| 6,816,995 B2 | * | 11/2004 | Yokogawa | 716/1 |
| 7,109,483 B2 | * | 9/2006 | Nakasuji et al. | 250/310 |
| 7,127,098 B2 | * | 10/2006 | Shimoda et al. | 382/145 |
| 7,135,344 B2 | * | 11/2006 | Nehmadi et al. | 438/14 |
| 7,155,689 B2 | * | 12/2006 | Pierrat et al. | 716/4 |
| 7,231,628 B2 | * | 6/2007 | Pack et al. | 716/19 |
| 7,289,933 B2 | * | 10/2007 | Luo et al. | 702/167 |
| 7,320,115 B2 | * | 1/2008 | Kuo | 716/4 |
| 2005/0010890 A1 | * | 1/2005 | Nehmadi et al. | 716/19 |
| 2007/0288219 A1 | * | 12/2007 | Zafar et al. | 703/14 |
| 2008/0092095 A1 | * | 4/2008 | Lanzerotti et al. | 716/5 |

FOREIGN PATENT DOCUMENTS

JP    2000-294611 A    10/2000

* cited by examiner

*Primary Examiner*—Naum B Levin
(74) *Attorney, Agent, or Firm*—Crowell & Moring LLP

(57) ABSTRACT

A system and a method for detecting a defect, capable of extracting a defect occurring depending on finishing accuracy required for circuit operation are provided. The system includes a timing analyzer for extracting a critical path in which a high accuracy is required for a signal transmission operation as compared with other portions based on circuit design data, a critical path extractor for comparing the circuit design data with layout design data on a pattern and for extracting graphical data including the critical path extracted by the timing analyzer, an inspection recipe creator for deciding a portion to be inspected, based on coordinate information on the graphical data including the critical path extracted by the critical path extractor, and an SEM defect review apparatus for acquiring an image of the decided portion to be inspected on a wafer according to an inspection recipe created by the inspection recipe creator.

10 Claims, 10 Drawing Sheets

SYSTEM AND METHOD FOR DETECTING DEFECTS IN A SEMICONDUCTOR DURING MANUFACTURING THEREOF

CLAIM OF PRIORITY

The present application claims priority from Japanese patent application JP 2006-174399 filed on Jun. 23, 2006, the content of which is hereby incorporated by reference into this application.

BACKGROUND OF THE INVENTION

1. Field of the Invention

The present invention relates to a system, a method, and a program for detecting a defect of a semiconductor during semiconductor manufacturing process.

2. Related Art

An electron microscope typified by a scanning electron microscope (SEM) is now essential as a semiconductor process evaluation tool. Actually, however, the electron microscope has a limited inspection field of view because of its high magnification as compared with an optical microscope, and it still takes lots of time and labor for the electron microscope to inspect an entire surface of a wafer. Due to these, it is conventionally general to perform optical defect detection, extract a portion to be inspected, at high speed from data on a position and a magnitude of a defect on the surface of the wafer, and then observe a shape of the defect extracted by the optical defect detection using the electron microscope. Nevertheless, it is unclear how the defect differs in shape from a semiconductor pattern design only by recognizing the shape, the magnitude, the position and the like of the defect.

To solve the disadvantage, there is proposed a method for classifying a defect by superimposing a defect image acquired by the electron microscope on a pattern profile based on layout design data on a semiconductor pattern using CAD (Computer Aided Design) (hereinafter, "CAD data"), and by comparing the CAD data with the shape of the defect image (see Japanese Patent Application Laid-Open No. 2000-294611).

Generally, in the optical defect detection, a portion having a different shape is extracted by comparison of an image acquired for every chip (die) on a wafer with an image acquired from another chip. Since the extracted portion differs in shape from that on another chip, the extracted portion highly likely includes a defect, e.g., adhesion of a contamination onto the wafer, occurring randomly (hereinafter, "random defect") in a semiconductor manufacturing process. The optical proximity effect (OPE) has a yearly increasing severe influence on formation of a semiconductor pattern, with the refinement of the semiconductor pattern. Due to this, a defect resulting from a pattern layout, a shape of a mask pattern by optical proximity correction (OPC), or an operating state, an operating condition or the like of an exposure device tends to occur. Differently from the random defect, such a defect (hereinafter, "systematic defect") is difficult to detect by the optical detection because the systematic defect equally occurs to each chip.

At present, therefore, a shape of a pattern to be formed on a wafer after exposure under planned conditions is simulated based on design data, exposure condition and the like of a mask pattern that has been subjected to an OPC processing. A portion in which a shape difference exceeds a pre-considered standard is detected as an OPC risky region by comparing the resulted shape of the pattern from simulation with CAD data, thereby detecting a portion having a greater risk of occurrence of a systematic defect.

However, a circuit structure of a semiconductor is more complicated as recent high integration progresses rapidly. In some cases, a portion that appears to have no adhesion of a contamination and to be finished into a shape close to that of the CAD data causes a malfunction. Such a defect often occurs to, for example, a fine and thin portion in which quite high accuracy is required for signal transmission rate and circuit operation timing during actual operation. It is difficult to extract the defect occurring depending on a finishing accuracy required for circuit operation, by the above-stated method for detecting a defect only based on the shape.

SUMMARY OF THE INVENTION

The present invention has been made in view of the above-stated circumstances. It is an object of the present invention to provide a system and a method for detecting a defect capable of extracting a defect occurring depending on a finishing accuracy required for circuit operation.

To attain the object, according to the present invention, a critical path on a circuit that is required to have severer accuracy for signal transmission operation than those of other portions is extracted as a portion to be inspected, based on circuit design data, and an image of the extracted portion to be inspected is acquired using an SEM.

According to the present invention, it is possible to extract a defect occurring depending on the finishing accuracy required for circuit operation.

DETAILED DESCRIPTION OF THE INVENTION

An embodiment of the present invention will be described hereinafter with reference to the drawings.

1. Overall Configuration of Defect Detecting System

Figure 1:
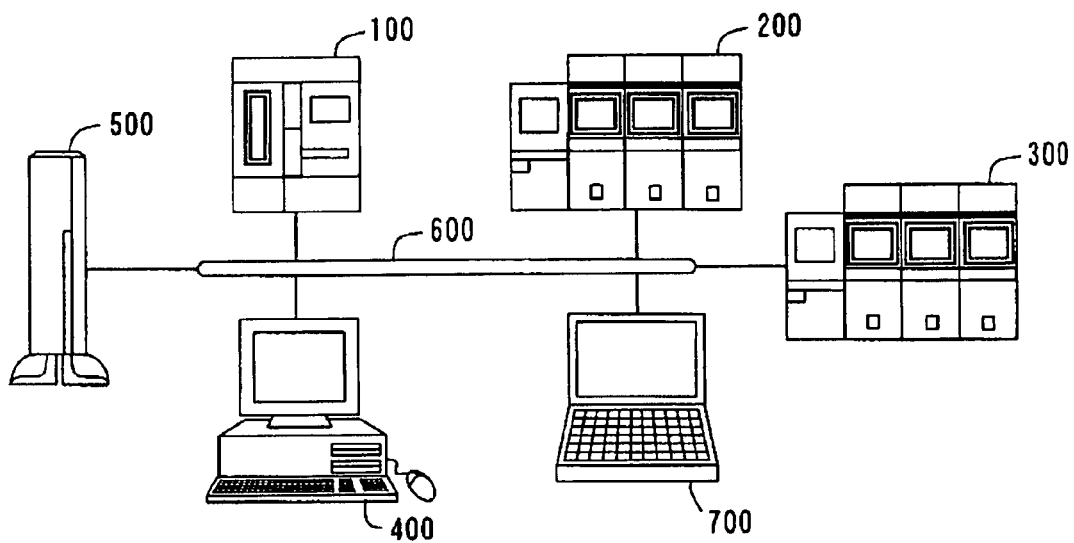
FIG. 1 is an exemplary diagram showing an entire configuration of a defect detecting system according to an embodiment of the present invention.

FIG. 1 is an exemplary diagram showing an entire configuration of a defect detecting system according to the embodiment of the present invention.

The defect detecting system shown in FIG. 1 is constructed by connecting an optical detecting apparatus 100 serving as a defect detecting unit for detecting a position and a magnitude of a defect on a wafer, an SEM defect detecting apparatus 200 serving as a defect image detecting unit for detecting an image at the defect coordinate position detected by the optical detecting apparatus 100, an SEM defect review apparatus 300 for inspecting a portion to be inspected on the wafer that is finally extracted, a server 500 for storing therein necessary data, and a computer 400 for transmitting and receiving data and signals to and from the respective apparatuses in relation to extraction of the portion to be inspected, to one another via a LAN (local area network) 600. Alternatively, a computer 700 used by a semiconductor designer, a client or the like may be connected to this defect detecting system, and design information on a semiconductor and a mask pattern or the like stored in the computer 700 may be output to via the LAN 600 (or the Internet on need) and stored in server 500.

FIG. 1 shows an example in which the optical detecting apparatus 100, the SEM defect detecting apparatus 200, the SEM defect review apparatus 300, the computer 400, and the server 500 are all constructed separately and connected to one another via the LAN 600. However, as long as the entire system includes desired functions, a functional or structural definition of each of the apparatuses is not limited to a specific one. For example, if a capacity of storage device of the computer 400 has to spare, necessary databases may be constructed in the storage device of the computer 400 without providing the server 500. Furthermore, the optical detecting apparatus 100 may be replaced by an electron beam detecting apparatus. In this case, the SEM defect detecting apparatus 200 may be omitted if it is unnecessary. Namely, if the SEM defect detecting apparatus can inspect the entire surface of the wafer and acquire a coordinate, an image, and the like of the defect, it is not always necessary to provide the optical detecting apparatus.

2. Configuration of SEM Defect Detecting Apparatus 200 and Review Apparatus 300

Figure 2:
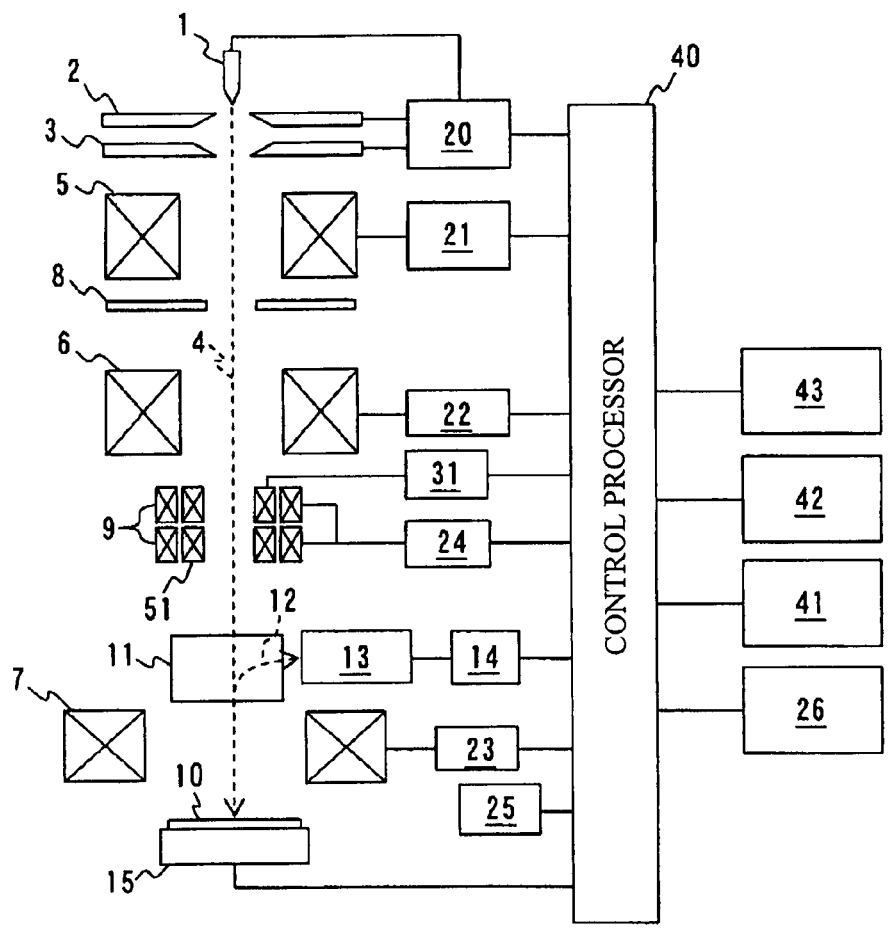
FIG. 2 is a block diagram showing a schematic configuration of a scanning electron microscope (SEM) employed as an SEM defect detecting apparatus or an SEM defect review apparatus included in the defect detecting system according to the embodiment of the present invention.

FIG. 2 is a block diagram showing a schematic configuration of a scanning electron microscope (SEM) employed as the SEM defect detecting apparatus 200 or the review apparatus 300.

Referring to FIG. 2, a voltage is applied between a cathode 1 and a first anode 2 from a high voltage control power supply 20 controlled by a control processor 40, and a primary electron beam 4 is extracted from the cathode 1 with a predetermined emission current. An acceleration voltage is applied between the cathode 1 and a second anode 3 from the high voltage control power supply 20 controlled by the control processor 40, and the primary electron beam 4 emitted from the cathode 1 is accelerated and moved to a lens system arranged in a subsequent stage.

The primary electron beam 4 is converged by a convergent lens 5 controlled by a lens control power supply 21, from which unnecessary ranges of the primary electron beam are removed by an aperture plate 8, and then converged onto a sample 10 as a micro spot by both a convergent lens 6 controlled by the lens control power supply 22 and an objective lens 7 controlled by an objective lens control power supply 23.

As the objective lens 7, any one of lenses of various types such as an in-lens objective lens, an out-lens objective lens, and a snorkel (semi-in-lens) objective lens can be used. Further, a retarding method for applying a negative voltage to the sample and decelerating the primary electron beam can be used. Moreover, each of the lenses may be an electrostatic lens configured to include a plurality of electrodes.

The primary electron beam 4 is two-dimensionally scanned with respect to an irradiation position on the sample 10 by a scanning coil 9 controlled by a scanning coil control power supply 24. A secondary signal 12 such as secondary electrons generated from the sample 10 by irradiation of the primary electron beam is moved over the objective lens 7, separated from primary electrons by an orthogonal electromagnetic field generator 11 for separating the secondary signal, and detected by a secondary signal detector 13. The signal detected by the secondary signal detector 13 is amplified by a signal amplifier 14, transferred to an image memory 25, and displayed on an image display device 26 as a sample image. A two-stage deflection coil (an objective lens aligner) 51 controlled by an objective lens aligner control power supply 31 is arranged at the same position as the scanning coil 9, and can two-dimensionally control a position (i.e., an observation field of view) of the primary electron beam 4 on the sample 10. A stage 15 can move the sample 10 at least in two directions (X and Y directions) in plane perpendicular to the primary electron beam.

As the sample 10, a wafer in a process of manufacturing a semiconductor product, for example, is employed. Alternatively, a resist pattern formed on the wafer by lithographic step may be used as the sample 10.

A pointing device 41 can acquire information on a position of the sample image by designating the position. Image scanning conditions (such as a scanning speed of an electron beam and the number of accumulated images), designation of a field-of-view correcting method, image output and storage, and the like can be designated from an input device 42.

Address signals corresponding to a position of the image memory are generated in a control system or a computer provided separately, and are converted into analog signals, and the analog signals are supplied to the scanning coil. If the image memory has, for example, 512×512 pixels, then the address signal in the X direction is a digital signal which runs from 0 to 512 cyclically, and the address signal in the Y direction is a digital signal which is both incremented by 1 when the address signal in the X direction reaches from 0 to 512, and runs from 0 to 512 cyclically.

Since an address of the image memory corresponds to that of a deflection signal for scanning the electron beam, a two-dimensional image of a deflected region of the electron beam by the scanning coil is recorded in the image memory. Signals in the image memory can be sequentially read in time series by a read address generation circuit which is synchronized with a read clock. The signal read according to an address is converted into an analog signal and becomes a brightness modulated signal for the image display device 9.

The apparatus described in the embodiment includes a function of forming a line profile based on the detected secondary electrons, reflected electrons or the like. The line profile is formed based on a quantity of detected electrons, brightness information on the sample image, or the like when the primary electron beam is scanned either one-dimensionally or two-dimensionally. The obtained line profile is used for measurement of, for example, a dimension of a pattern formed on a semiconductor wafer, or the like.

Moreover, the SEM defect detecting apparatus 200 or the SEM defect review apparatus 300 includes functions of preliminarily storing, as a recipe, conditions (measurement portions, optical conditions of the scanning electron microscope, and the like) input from the computer 400 when, for example, a plurality of points on the semiconductor wafer are observed, and of making a measurement or an observation according to a content of the recipe.

It has been described that the control processor 40 is integral with the scanning electron microscope or quasi-integral therewith, with reference to FIG. 1. Needless to say, the configuration is not limited to the above-stated configuration. A processor provided separately from the scanning electron microscope may perform its processings. In this case, it is necessary to provide both a transmission medium for transmitting a detect signal detected by a secondary signal detector to the processor as an image and an input/output terminal for inputting/outputting a signal transmitted via the transmission medium. Moreover, the SEM defect detecting apparatus 200 or the SEM defect review apparatus 300 includes an input/output interface (I/O) 43 for connecting to the LAN 600, the other apparatus or the like and for transmitting and receiving signals bidirectionally. In the example of the configuration shown in FIG. 1, the I/O 43 of the SEM defect detecting apparatus 200 or the SEM defect review apparatus 300 is connected to the LAN 600 and thereby connected to the other apparatus such as the computer 400 connected to the LAN 600.

3. Configuration of Server 500

Figure 3:
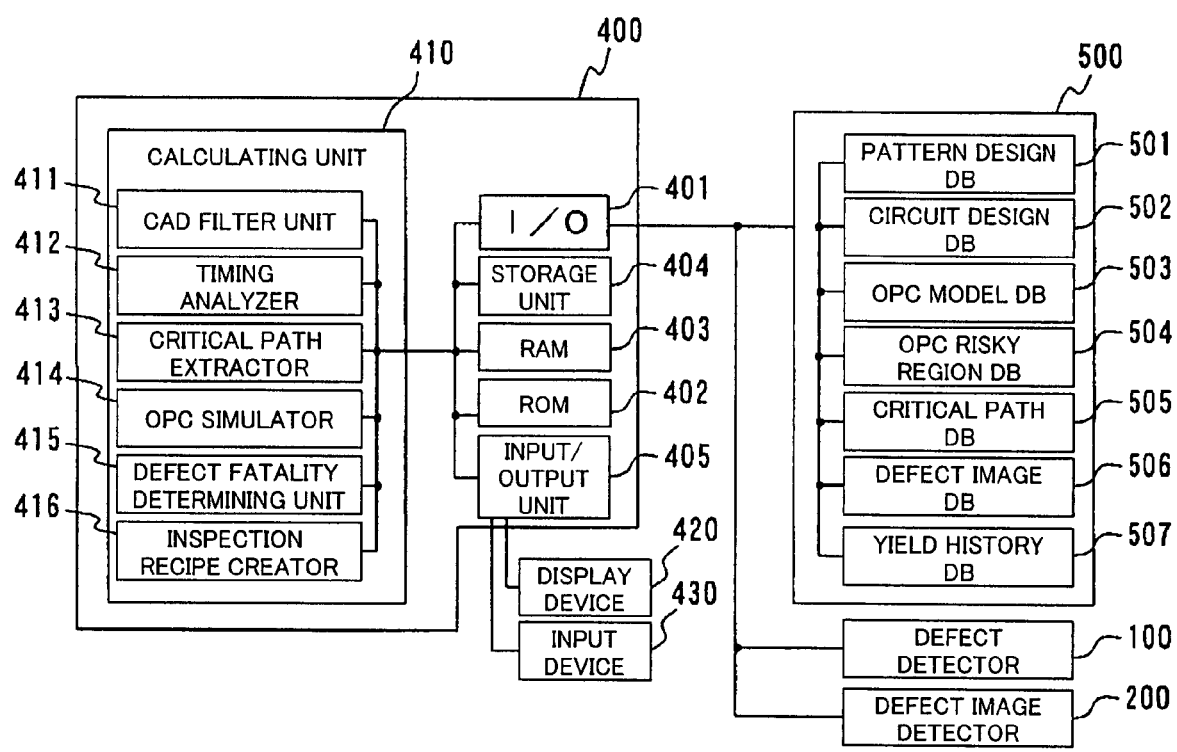
FIG. 3 is a block diagram showing schematic configurations of a computer and a server included in the defect detecting system according to the embodiment of the present invention.

FIG. 3 is a block diagram showing schematic configurations of the computer 400 and the server 500 included in the defect detecting system according to the embodiment of the present invention. In FIG. 3, the same constituent elements or constituent elements similar in function to those already shown in the preceding figures are denoted by the same reference symbols, respectively and will not be described.

The server 500 includes a pattern design database 501 for storing therein layout design data (e.g., CAD data) on the semiconductor pattern, a circuit design database 502 for storing therein circuit design data (e.g., circuit diagrams) on the semiconductor, an OPC model database 503 for storing therein design data on a mask pattern that has been subjected to the OPC processing based on the layout design data or the like, an OPC risky region database 504 for storing therein information on OPC risky regions (to be described later) identified by OPC simulation, a critical path database 505 for storing therein graphical data including a risky region in terms of circuit (to be described later) identified based on information stored in the pattern design database 501 and the circuit design database 502 or the like, a defect image database 506 for storing therein a defect image acquired by the SEM defect detecting apparatus 200, and a yield history database 507 for storing therein a yield history of a semiconductor manufacturing process to be controlled.

A type of each of the CAD data stored in the pattern design database 501 may be a format type with which a graphic (e.g., a pattern profile) based on the CAD data can be displayed by image display software used in the computer 400, the SEM defect detecting apparatuses 200 and 300, and the like. The CAD data is obtained by converting the circuit design data and related to the circuit design data. It is identified in advance which signal transmission path on the circuit design data a specific graphic on the pattern layout corresponds to. The yield history stored in the yield history database 507 is various data on a defective lot, such as pattern layout information (e.g., CAD data) and circuit design data on a semiconductor determined as a defective product, detected defect information (magnitude, position, etc.), a model number of the exposure device, and an exposure condition.

4. Configuration of Computer 400

The computer 400 includes an input/output interface (I/O) 401 for transmitting and receiving signals to and from an external apparatus, a ROM 402 for storing therein constants and the like necessary for a program and a processing related to detection and analysis of a defect of the semiconductor wafer, a calculating unit 410 for performing various calculation process, a RAM 403 for temporarily storing therein a calculation result, data on calculation halfway of the calculating unit 410, and the like, a storage device 404 for storing therein various data, and an input/output unit 405 for transmitting and receiving signals to and from a display device 420 such as a monitor, and an input device 403 such as a keyboard and a pointing device.

The calculating unit 410 includes a CAD filter unit 411, a timing analyzer 412, a critical path extractor 413, an OPC simulator 414, a defect fatality determining unit 415, and an inspection recipe creator 416.

(4-1) Timing Analyzer

The timing analyzer 412 performs processings for analyzing a signal transmission operation performed in a circuit on the design when a signal is output to the circuit, based on the information stored in the circuit design database 502, and for extracting a signal transmission path (hereinafter, "critical path") for which finishing of the pattern should be emphatically managed because a severer timing accuracy is required than the other regions in view of the signal transmission operation performed in the circuit. Information (e.g., net list data) on the critical path extracted by the processing in the timing analyzer 412 is temporarily stored in the RAM 403. At the same time, the information may be stored in the storage device 404.

(4-2) Critical Path Extractor

The critical path extractor 413 performs a processing for analyzing which graphic on the pattern layout corresponds to the critical path, based on both the critical path extracted by the timing analyzer 412 and the information stored in the pattern design database 501. Graphic data including the critical path on the pattern layout, which is extracted by the critical path extractor 413, is transmitted to and stored in the critical path database 505. At the same time, the graphic data may be stored in the storage device 404 or the like.

(4-3) OPC Simulator

The OPC simulator 414 performs processings for simulating a shape of a pattern formed on the wafer after exposure, based on the information stored in the OPC model database 503, the exposure device to be used, the exposure condition and the like, and for extracting a portion in which a difference between a predicted shape of the pattern and the shape in the design data exceeds a threshold value, as an OPC risky region, based on the simulation result. Coordinate data on the OPC risky region extracted by the OPC simulator 414 or graphic data on a pattern of the OPC risky region is transmitted to and stored in the OPC risky region database 504. At the same time, the coordinate data or graphic data may be stored in the storage device 404 or the like.

(4-4) CAD Filter Unit

The CAD filter unit 411 performs processings for comparing detected defect information (a coordinate and a magnitude of each defect) detected by the optical detecting apparatus 100 with the information stored in the pattern design database 501, and for determining whether or not it is necessary to inspect each detected defect, based on a positional relationship between the detected defect and the layout design data of the semiconductor pattern.

By way of example, a determination by the CAD filter unit 411 as to whether or not it is necessary to inspect each detected defect is made according to a predetermined rule for every functional region by classifying functional regions such as the RAM on the pattern layout, and setting a level of importance of a defect inspection for every functional region, e.g., it is unnecessary to inspect a defect in a low level-of-importance region depending on the magnitude of the defect and it is necessary to inspect a defect in a high level-of-importance region even if the defect is very small. Alternatively, a determination method may be applicable, which includes preparing a threshold value for the positional relationship between each defect detected by the optical defect detecting apparatus 100 and the pattern, and classifying a defect that exceeds the threshold value (that has a large amount of overlap with the pattern) as a defect necessary to inspect or classifying a defect that causes a specific failure, e.g., a defect that straddles a plurality of patterns to cause a short circuit or the like, as a defect necessary to inspect.

The positional information and magnitude of each defect determined to be necessary to inspect by the CAD filter unit 411 is stored in either the RAM 403 or the storage unit 404. Further, the CAD filter unit 411 creates an SEM image acquisition condition, i.e., a recipe for the SEM defect detecting unit 200 (an inspection coordinate, a pixel size, a beam diameter, a beam acceleration voltage, a threshold value for a detected secondary voltage, and the like), based on the information on the position and the magnitude of each defect. The created recipe is stored in, for example, the RAM 403 or the storage unit 404, and then transmitted via the LAN 600 to input to the SEM defect detecting apparatus 200 via the input/output interface 43. The control processor 40 acquires an image of a corresponding portion on the wafer based on the received positional information of the defect. The acquired defect image data is transmitted to the defect image database 506 via the LAN 600 and stored in the defect image database 506.

(4-5) Defect Fatality Determining Unit

The defect fatality determining unit 415 performs processings for reading the defect image acquired by the SEM defect detecting apparatus 200 from the defect image database 506, comparing the read defect image with the information stored in the pattern design database 501, and determining a fatality of each detected defect based on the positional relationship between the detected defect and the layout design data on the semiconductor pattern, and the like. The positional information and magnitude information on each defect, extracted by the defect fatality determining unit 415, are stored in the RAM 403, the storage device 404 or the like.

As a fatality determining method carried out by the defect fatality determining unit 415, a determining method may be applicable which includes, for example, preparing a threshold value for the positional relationship between each defect image and the pattern, and classifying a defect that exceeds the threshold value (that has a large amount of overlap with the pattern) as a fatal defect or classifying a defect that causes a specific failure, e.g., a defect that straddles a plurality of patterns to cause a short circuit as a fatal defect.

(4-6) Inspection Recipe Creator

The inspection recipe creator 416 decides a portion to be inspected to be finally reviewed by the SEM defect review apparatus 300, based on the defect information extracted by the defect fatality determining unit 415, the critical path information stored in the critical path database 505, the OPC risky region information stored in the OPC risky region database 504, and the like. Furthermore, the inspection recipe creator 416 creates an inspection condition, i.e., a recipe for the SEM defect review apparatus 300 (an inspection coordinate, a pixel size, a beam diameter, a beam acceleration voltage, a threshold value for a detected secondary voltage, and the like). The created recipe is stored in, for example, the RAM 403 or the storage unit 404 and output to the input/output interface 43 of the SEM defect review apparatus 300. The SEM defect review apparatus 300 acquires an image of the designated portion to be inspected, based on recipe information received via the input/output interface 43. The acquired image data is transmitted to the defect image database 505 via the LAN 600 and stored in the defect image database 505.

A program related to processing procedures for the respective processing units 411 to 416 constituting the calculating unit 410 is stored in the ROM 402. The processing procedures for the respective processing units 411 to 416 will be described later.

5. Explanation of Operation

Operation performed by the defect detecting system configured as stated above according to the embodiment will be described below.

(5-1) Outline of Overall Operation

Figure 4:
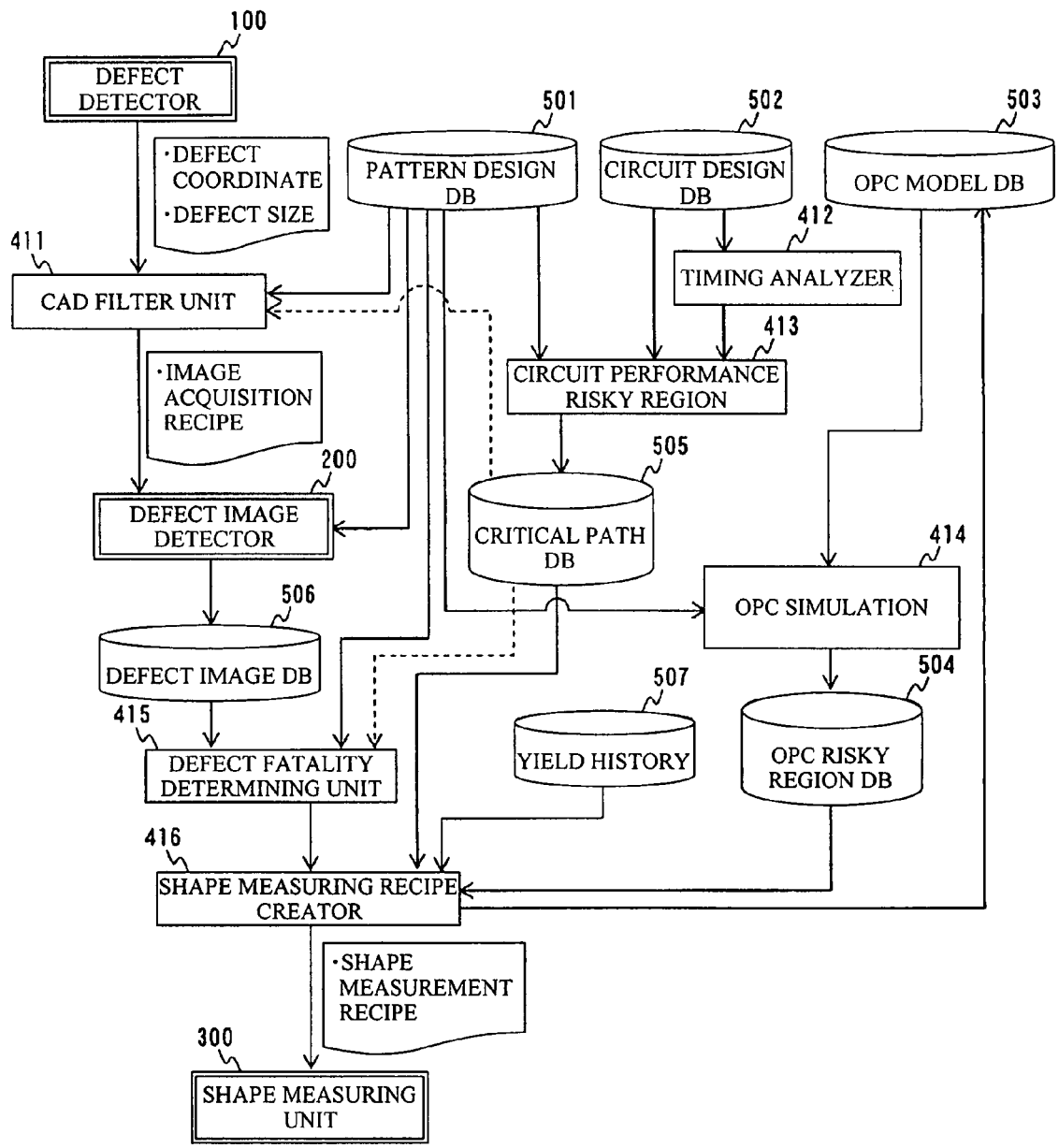
FIG. 4 is a functional block diagram showing an entire configuration of the defect detecting system according to the embodiment of the present invention.
Figure 5:
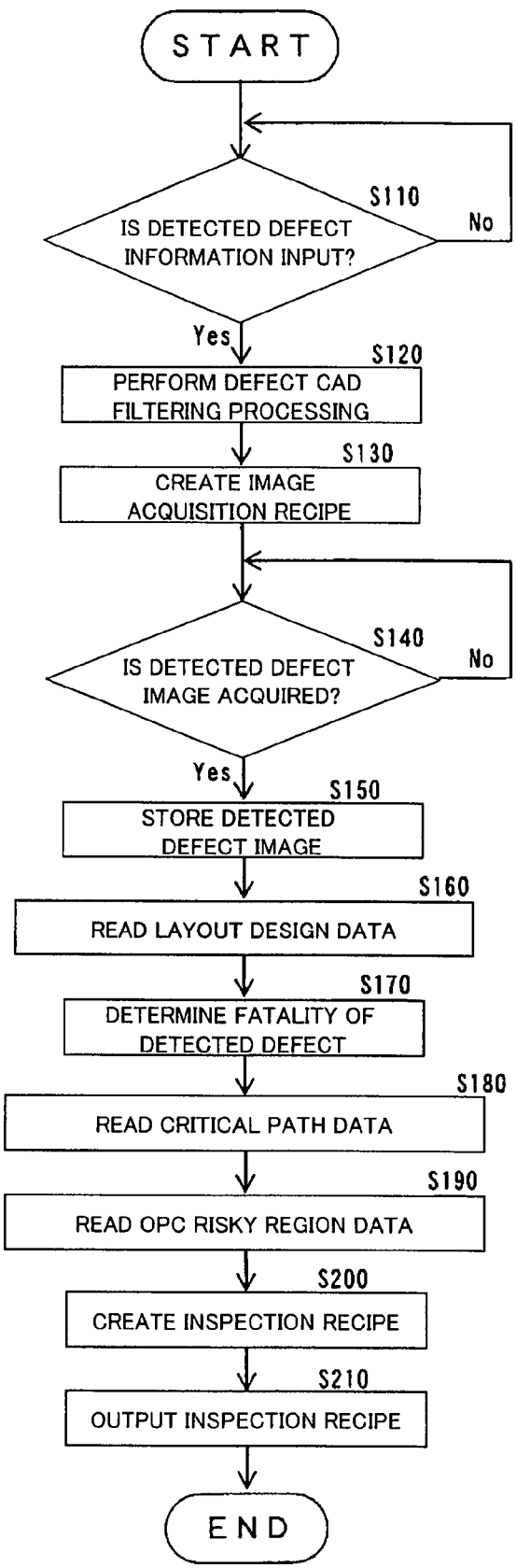
FIG. 5 is a flowchart showing an outline of a processing procedure performed by the computer included in the defect detecting system according to the embodiment of the present invention.

FIG. 4 is a block diagram of an entire configuration of the defect detecting system according to the embodiment. FIG. 5 is a flowchart showing an outline of the processing procedure performed by the computer 400.

In FIG. 4, the same constituent elements or constituent elements similar in function to those already shown in the preceding figures are denoted by the same reference symbols, respectively.

Referring to both FIGS. 4 and 5, the computer 400 repeatedly determines whether information (the coordinate and the magnitude) on each detected defect extracted as a result of the optical defect detection made by the optical detecting apparatus (defect detecting unit) 100 is input to the computer 400 via the I/O 401 at a step 110. If it is confirmed that the detected defect information is input, the procedure goes to a step 120.

At the step 120, the computer 400 reads out a program for the defect CAD filtering processing stored in the ROM 402, causes the CAD filter unit 411 to filter the detected defect information inputted at the step 110 according to the program as will be described later, and extracts a portions to be inspected by the SEM defect detecting apparatus 200 from the defects extracted by the optical detecting apparatus 100. The data on the coordinate and the size of each extracted defect whose SEM image the SEM defect detecting apparatus 200 is to acquire is stored in the RAM 403 or the storage unit 404.

The procedure goes to a subsequent step 130, at which the computer 400 creates an image acquisition recipe from the data on the coordinate and the like of each detected defect extracted at the step 120, stores the created recipe in, for example, the RAM 403 or the storage device 404, and outputs the recipe to the SEM defect detecting apparatus (defect image detecting unit) 200. When the wafer that has been inspected by the optical defect detecting apparatus 100 is loaded to the SEM defect detecting apparatus 200, the SEM defect detecting apparatus 200 acquires a defect image in the designated portion (i.e., the to-be-inspected portion extracted at the step 120) according to the inputted inspection recipe corresponding to the wafer.

The procedure goes to a step 140, at which the computer 400 repeatedly determines whether each detected defect image is input to the computer 400 from the SEM defect detecting apparatus 200 via the I/O 401. If it is confirmed that each detected defect image is input, the procedure goes to a step 150.

At the step 150, the computer 400 outputs the detected defect image inputted from the SEM defect detecting apparatus 200 to the server 500, to store the detected defect image in the defect image database 506. At this time, the detected defect image may be stored not only in the defect image database 506 but also the RAM 403 and the storage unit 404.

The procedure goes to a step 160, at which the computer 400 reads out each defect image acquired by the SEM defect detecting apparatus 200 from the defect image database 506, and reads graphical data (CAD data) of a pattern in a coordinate position corresponding to the read defect image, from the pattern design database 501.

At a step 170, the computer 400 superimposes defect images read out at step 160 upon the graphical data of the corresponding portions to the defect images and compares the positional relationship between them as described later, thereby extracting to-be-inspected portion candidates the shape of each of which the SEM defect review apparatus 300 needs to measure. The procedure goes to a subsequent step 180. It is to be noted that the coordinate, the magnitude, the image and the like of the defect determined as a fatal defect as a result of the defect fatality determination at the step 170 are stored in the RAM 403 or the storage unit 404.

At the step 180, the computer 400 reads out graphical data (or coordinate data) including a critical path, from the critical path database 505. At a step 190, the computer 400 reads graphical data (or coordinate data) on OPC risky regions from the OPC risky region database 504. The critical path data and the OPC risky region data are extracted separately by processings (to be described later) in the timing analyzer 412, the critical path extractor 413, and the OPC simulator 414, and are stored in the critical path database 505 and the OPC risky region database 504, respectively.

The procedure goes to a step 200, at which the computer 400 reads the image data (or coordinate data) on each defect determined as a fatal defect at the step 170, from the RAM 403 or the storage unit 404. Further, the computer 400 causes the inspection recipe creator 416 to decide a portion to be inspected by the SEM defect review apparatus 300 and to create a recipe (already described) for inspection of the decided portion to be inspected, based on the read fatal defect data, the critical path and the OPC risky region data, the last two of which have been read at the step 180 and 190, respectively.

In the embodiment, the inspection recipe creator 416 performs the processing for deciding the portion to be inspected, at the step 200 as follows. First, the inspection recipe creator 416 extracts graphical data which includes the critical path including or overlapping partly with fatal defects (hereinafter, "first to-be-inspected portion candidates"), and graphical data on the OPC risky region including or overlapping partly with the fatal defects (hereinafter, "second to-be-inspected portion candidates"). Next, the inspection recipe creator 416 extracts all the graphical data appointed as the first or second to-be-inspected portion candidate, as final portions to be inspected.

After the processing is completed at the step 200, the procedure goes to a step 210, at which the computer 400 stores the inspection recipe created at the step 200 in the RAM 403 or the storage unit 404, and then outputs the inspection recipe to the SEM defect review apparatus 30, to finish the procedure shown in FIG. 5. As a result, the SEM defect review apparatus 300 acquires an image of each designated portion according to the inspection recipe, and the shape of each defect or the like is measured based on the image acquired by the SEM defect review apparatus 300.

(5-2) Defect CAD Filtering Processing

The defect CAD filtering processing at the step 120 shown in FIG. 5 will be described.

As already stated, when confirming that the defect information (coordinate and size) on each defect detected by the optical defect detecting apparatus 100 has been input at the step 110 shown in FIG. 5, the computer 400 causes the CAD filter unit 411 to perform the defect CAD filtering processing at the step 120.

Figure 6:
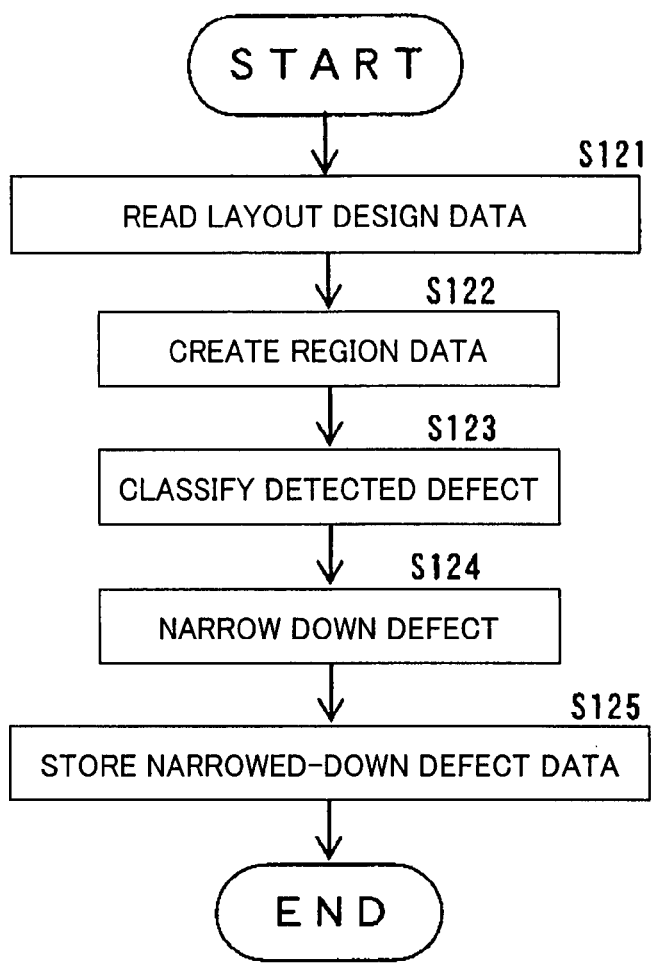
FIG. 6 is a flowchart showing a specific procedure of a defect CAD filtering processing performed by a CAD filter unit included in the defect detecting system according to the embodiment of the present invention.

FIG. 6 is a flowchart showing a specific procedure of the defect CAD filtering processing in the CAD filter unit 411.

When the procedure goes to the defect CAD filtering processing, the CAD filter unit 411 reads the layout design data (CAD data) from the pattern design database 501 at a step 121, and moves the procedure to a step 122.

At the step 122, the CAD filter unit 411 determines which region on the semiconductor each inputted defect detected by the optical defect detecting apparatus 100 belongs to by comparing the coordinate of each defect with the layout design data, and adds the region data to each defect.

Figure 7:
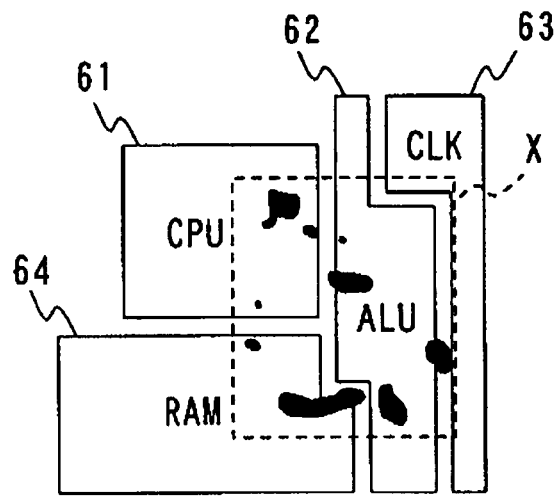
FIG. 7 is a conceptual diagram of region data used in the defect CAD filtering processing performed by the CAD filter unit included in the defect detecting system according to the embodiment of the present invention.

FIG. 7 is a conceptual view of the region data used in the defect CAD filtering processing by the CAD filter unit 411.

FIG. 7 shows an example in which defects (marked out in black) detected by the optical defect detecting apparatus 100 are present near portions in which functional regions of a CPU (central processing unit) 61, an ALU (arithmetic and logic unit) 62, a CLK (clock) 63, and a RAM (random access memory) 64 are laid out, respectively. Namely, at the step 122, the CAD filter unit 411 extracts layout design data around the defects on the basis of the coordinate data on the respective defects detected by the optical defect detecting apparatus 100. Further, the CAD filter unit 411 determines which functional region out of known functional regions (functional regions 61 to 64 in the example of FIG. 7) set at a design phase, each of the defects is present in (or whether each defect does not belong to any of the regions), and adds the region data to each defect.

The procedure goes to a step 123, at which the CAD filter unit 411 analyzes the positional relationship between each of the defects classified according to the regions and the pattern, and adds the analyzed positional relationship to the pattern (contact, crossing, inclusion or the like) to the data on each defect.

Figure 8:
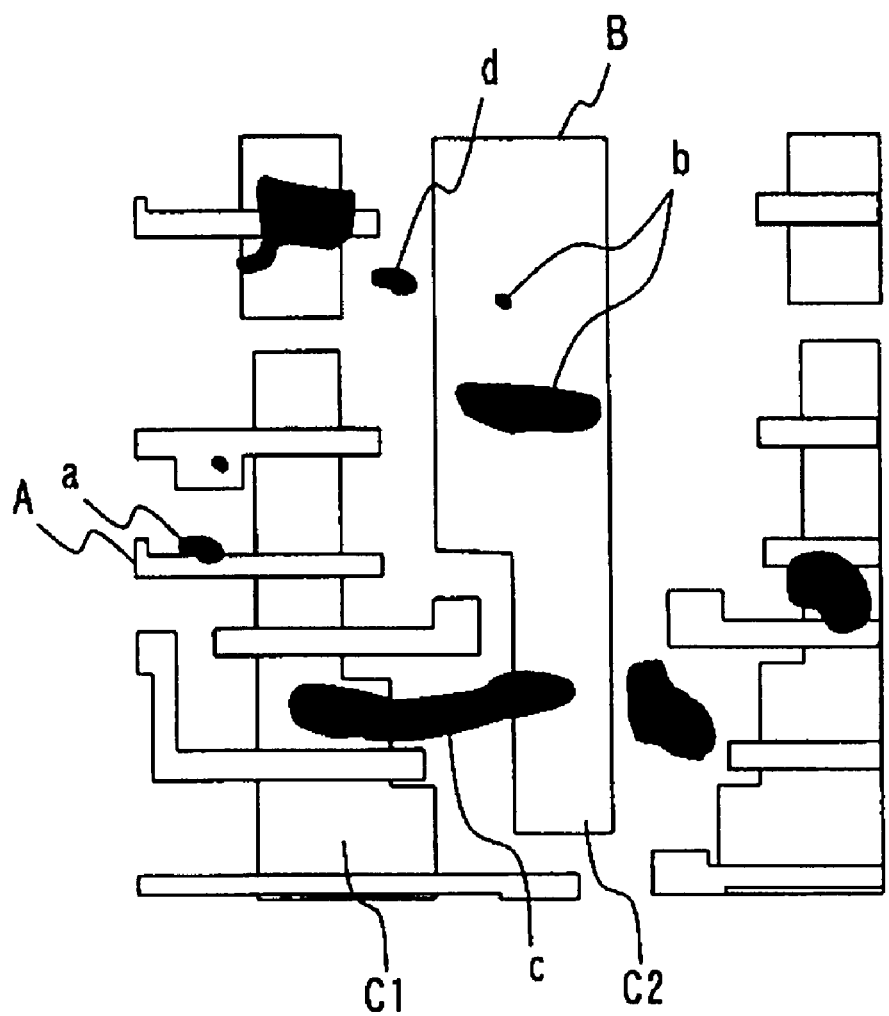
FIG. 8 is an exemplary diagram for explaining an analysis of the positional relationship between a detected defect and a pattern performed by the CAD filter unit included in the defect detecting system according to the embodiment of the present invention.

FIG. 8 is an exemplary diagram for explaining the analysis of the positional relationship between each detected defect and the pattern in the CAD filter unit 411.

It is assumed in FIG. 8 that the layout design data (CAD data) of a defect present region X indicated by a dotted line in FIG. 7 is displayed while being superimposed on the detected defects. In the example of FIG. 8, a defect a has a positional relationship to the pattern that the defect a overlaps with a pattern A (which positional relationship will be referred to as "contact"). A defect b has a positional relationship to the pattern that the defect b is entirely superimposed on a pattern B (which positional relationship will be referred to as "inclusion"). A defect c has a positional relationship to the pattern that the defect c straddles a plurality of (two in FIG. 8) patterns C1 and C2 (which positional relationship will be referred to as "crossing"). The defects also include those, such as a defect d, having a noncontact positional relationship to the pattern. The CAD filter unit 411 analyzes the positional relationship between each defect detected by the optical defect detecting apparatus 100 and the pattern as shown in FIG. 8 on the basis of the data on the coordinate and the size of each defect, and adds type data on the positional relationship to the pattern onto each defect.

The procedure goes to a step 124, at which the CAD filter unit 411 filters each defect based on the region data classified at the step 122 and the type data on the positional relationship to the pattern classified at the step 123, and narrows down the defects to a defect whose image the SEM defect detecting apparatus 200 is to acquire. This narrowing-down processing is performed according to a predetermined procedure. For example, the CAD filter unit 411 determines whether an attribute of the region data added to each defect or that of the type data on the positional relationship of each defect to the pattern indicates a high necessity of inspection, based on both the necessity of inspection set for every region data and the necessity of inspection set for every type data on the positional relationship to the pattern. If the attribute of the added region data or that of the type data on the positional relationship to the pattern indicates a high necessity of inspection, the CAD filter unit 411 determines the defect as a defect whose SEM image is to be acquired. Further, the CAD filter unit 411 excludes the other defects. Alternatively, the necessity of inspection may be set by a combination of the region data and the type data on the positional relationship to the pattern.

At a subsequent step 125, the CAD filter unit 411 stores data on the coordinate and the size of the defect to which the defects are narrowed down by the processing at the step 124 in the RAM 403 or the storage unit 404, thus finishing the procedure of the defect CAD filtering processing. After the end of the defect CAD filtering processing, the computer 400 moves the procedure to the step 130 (see FIG. 5) already stated above.

(5-3) Extraction of Critical Path

A processing for extracting the critical path read out by the computer 400 at the step 180 shown in FIG. 5 will be described.

The processing for extracting the critical path is performed separately from the flow shown in FIG. 5. The critical path (to be strict, the graphical data including the critical path) extracted as a result of the processing and stored in the critical path database 505 is read out by the computer 400 at the step 180 shown in FIG. 5 as already described. In the functional block diagram of FIG. 4, the layout design database 501, the circuit design database 502, the timing analyzer 412, the critical path extractor 413, and the critical path database 505 are mainly involved with this critical path extracting processing.

Figure 9:
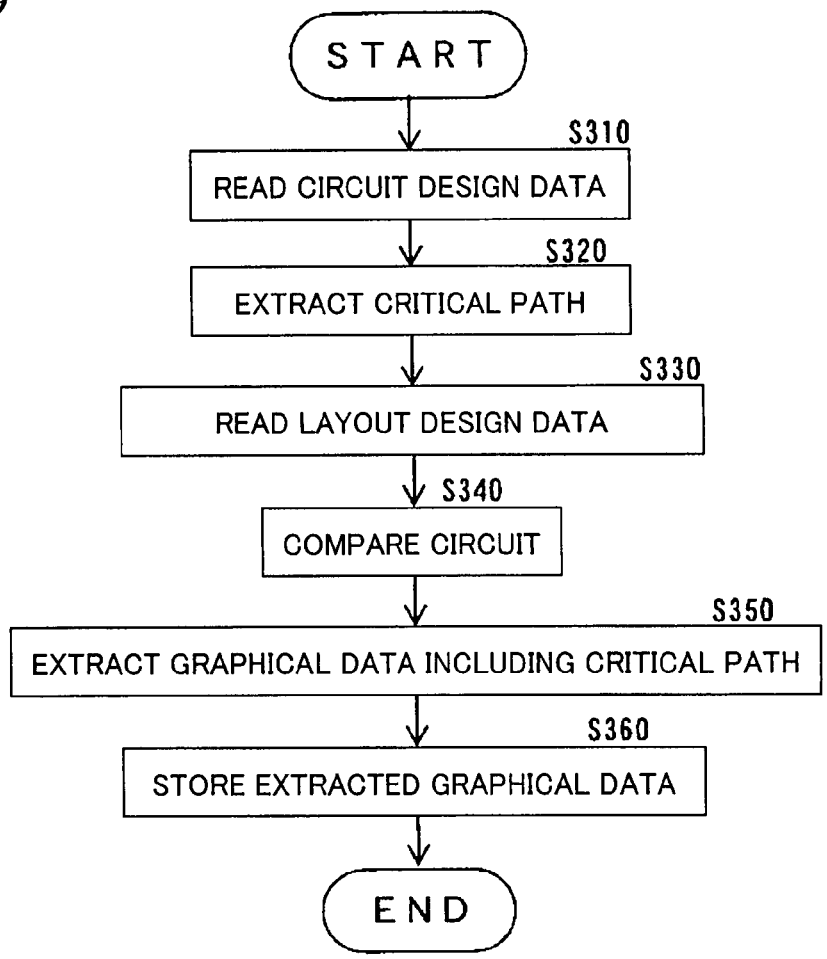
FIG. 9 is a flowchart showing a critical path extracting processing performed by a timing analyzer and a critical path extractor included in the defect detecting system according to the embodiment of the present invention.

FIG. 9 is a flowchart showing the critical path extracting processing performed by the timing analyzer 412 and the critical path extractor 413.

If the critical path on the circuit is to be extracted, the computer 400 first causes the timing analyzer 412 to read out the circuit design data (i.e., the circuit diagram and the net list representing wiring connection information on the semiconductor circuit based on the circuit diagram) from the circuit design database 502 at a step 310.

The procedure goes to a step 320, at which the timing analyzer 412 simulates a timing (or creates a timing chart) based on the read circuit design data, analyzes the signal transmission operation performed in a circuit on the design, and extracts a portion in which severer accuracy is required for the signal transmission operation than that in the other portions, in terms of circuit, that is, a critical path. The information of the net list on the critical path extracted by the processing in the timing analyzer 412, and the like is temporarily stored in the RAM 403. At the same time, the information may be stored in the storage device 404.

Figure 10:
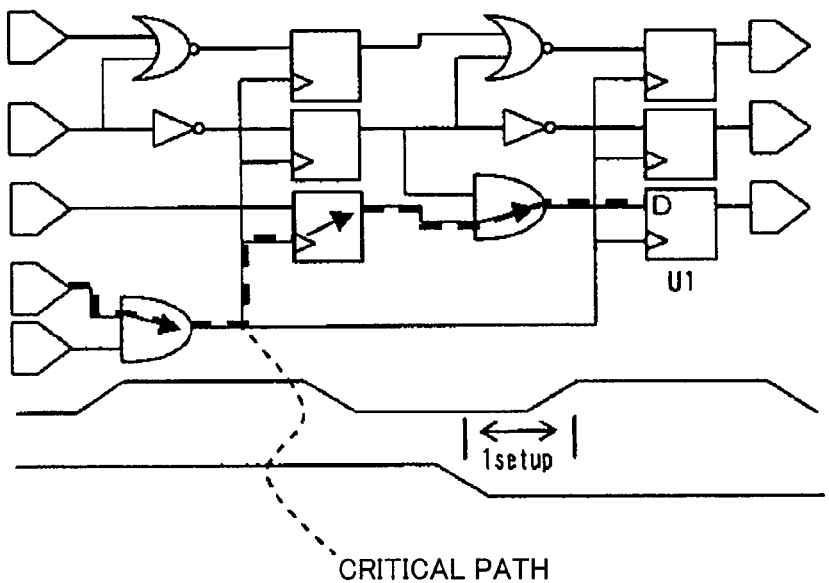
FIG. 10 is a schematic diagram showing a critical path (see a dotted line part) extracted by the critical path extractor included in the defect detecting system according to the embodiment of the present invention upon a circuit diagram.

FIG. 10 is a schematic diagram showing the critical path (see a dotted line part) extracted by the analysis, on the circuit diagram. A timing chart is shown below the circuit diagram.

The critical path extractor 413 reads the layout design data (CAD data) from the pattern design database 501 at a step 330, compares the layout design data with the circuit design data at a step 340 (performs LVS), and makes node information correspond to the layout design data. In this manner, the critical path extractor 413 identifies a position of the critical path extracted by the timing analyzer 412 on the layout design data (at a step 350), and analyzes which graphic on the pattern layout corresponds to the critical path.

Figure 11:
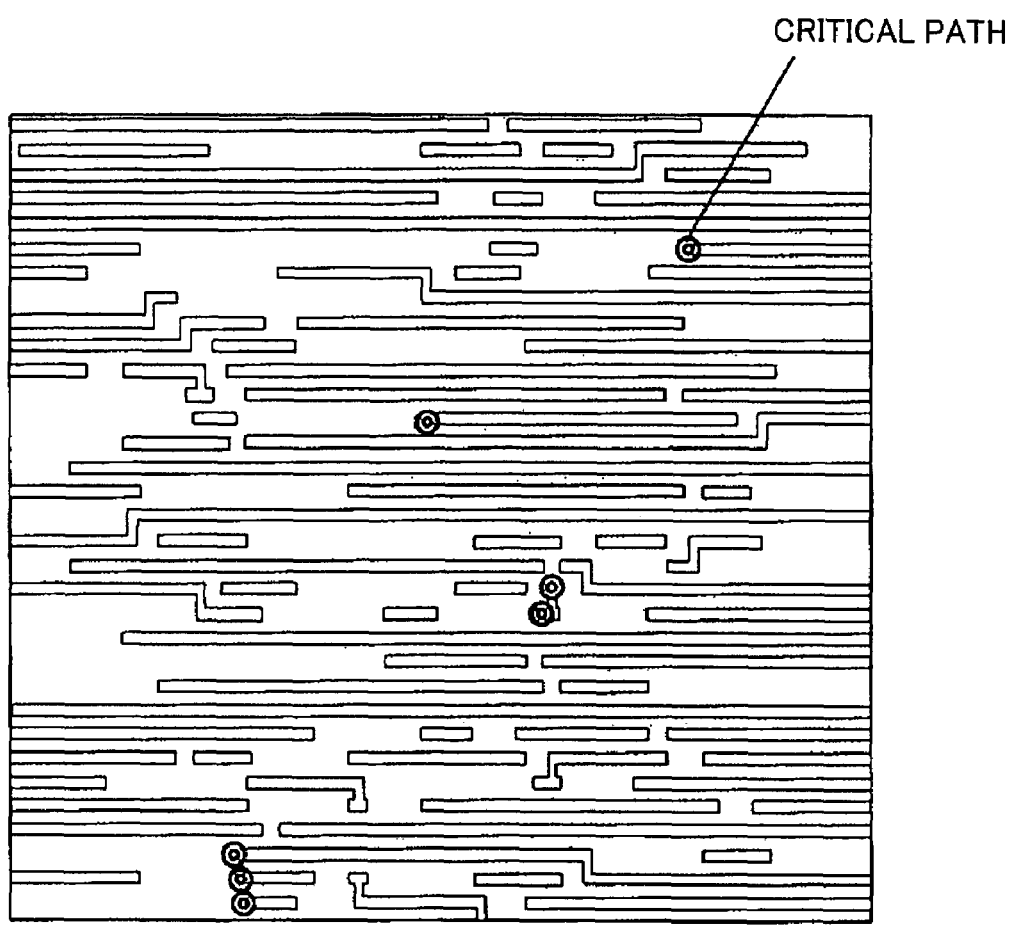
FIG. 11 is a schematic diagram typically showing the critical path extracted by the critical path extractor included in the defect detecting system according to the embodiment of the present invention upon layout design data.

FIG. 11 is a schematic diagram typically showing the identified critical path (see symbol ⊙ parts) on the layout design data.

The critical path extractor 413 moves the procedure to a step 360, at which the critical path extractor 413 extracts the graphical data on the critical path and stores the extracted graphical data in the critical path database 505. In the embodiment, the critical path extractor 413 finally extracts one graphic including the critical path as a circuit performance risky region and stores the extracted graphic in the critical path database 505. One graphic including the critical path means one closed graphic representing, for example, a wiring pattern or a contact hole.

(5-4) Extraction of OPC Risky Regions

A processing for extracting OPC risky regions read by the computer 400 at the step 190 shown in FIG. 5 will be described.

The processing for extracting the OPC risky regions is performed separately from the flow shown in FIG. 5. The OPC risky regions extracted as a result of the processing and stored in the OPC risky region database 504 are read out by the computer 400 at the step 190 shown in FIG. 5 as already described. In the functional block diagram of FIG. 4, the OPC model analyzer 503, the pattern design database 501, the OPC simulator 414, and the OPC risky region database 504 are mainly involved with this OPC risky region extracting processing.

Figure 12:
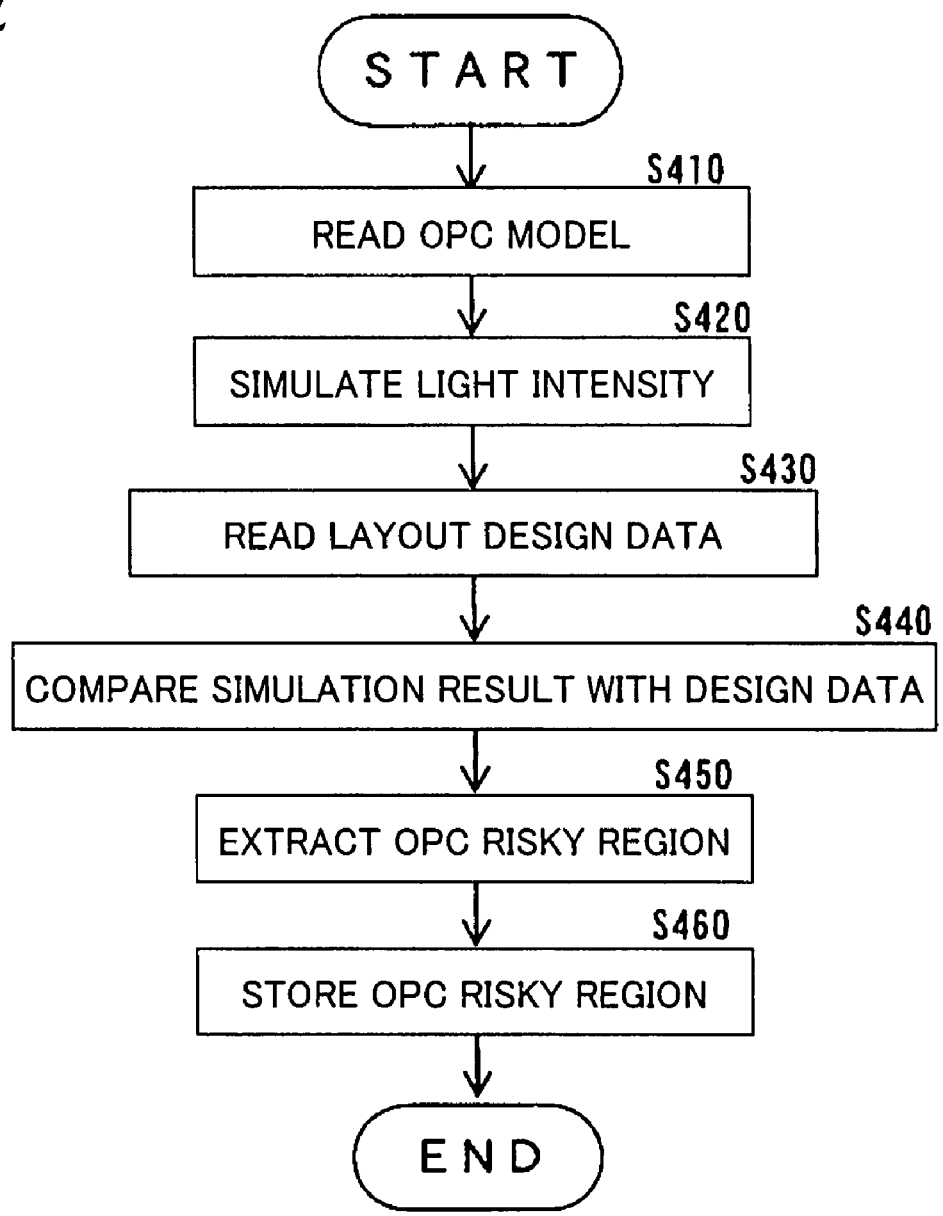
FIG. 12 is a flowchart showing an OPC simulation unit extraction procedure performed by an OPC simulator included in the defect detecting system according to the embodiment of the present invention.

FIG. 12 is a flowchart showing the OPC risky region extracting processing procedure performed by the OPC simulator 414.

When the OPC risky regions are to be extracted, the computer 400 first causes the OPC simulator 414 to read out an OPC model (design data on a mask pattern that has been subjected to the optical proximity correction) from the OPC model database 503 at a step 410.

The procedure goes to a step 420, at which the OPC simulator 414 performs a light intensity simulation on the shape of the pattern formed on the wafer after exposure, based on the read OPC model, the exposure device to be used, the exposure condition (preset value) and the like. The OPC simulator 414 creates contours representing light intensities (see FIG. 13) based on the simulation result, compares the contours with a predetermined threshold value, thereby creating a profile line of an image transferred onto the wafer (a predicted shape of the pattern) when exposure is performed using the OPC model. The created predicted shape of the pattern is temporarily stored in the RAM 403. At the same time, the created predicted shape of the pattern may be stored in the storage unit 404.

Figure 13:
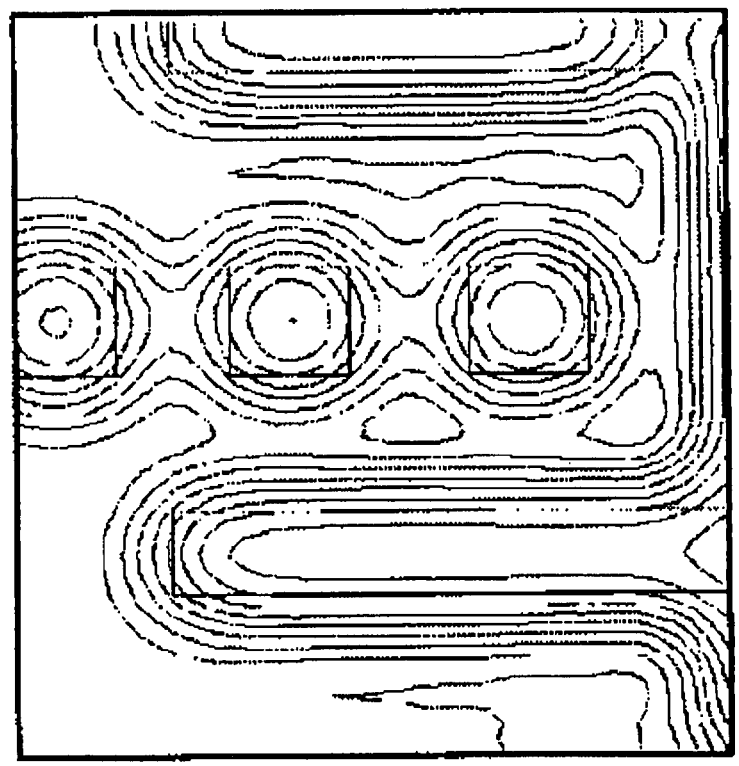
FIG. 13 is a diagram showing contours representing light intensities used for extraction of OPC risky regions by the OPC simulator included in the defect detecting system according to the embodiment of the present invention.

FIG. 13 is a diagram showing contours representing light intensities used for extraction of the OPC risky regions.

The OPC simulator 414 reads the layout design data (CAD data) from the pattern design database 501 at a step 430. The procedure goes to a step 440, at which the OPC simulator 414 reads the simulation result (data on the predicted shape of the pattern created at the step 420) from the RAM 403, and compares the predicted shape of the pattern with the layout design data by superimposing the predicted shape of the pattern on the layout design data. At a step 450, the OPC simulator 414 extracts regions in which the predicted shape of the pattern greatly differs from the layout design data (e.g., regions in which a distance between the predicted shape and the profile line of the design data is equal to or larger than the predetermined threshold value) as the OPC risky regions.

Figure 14:
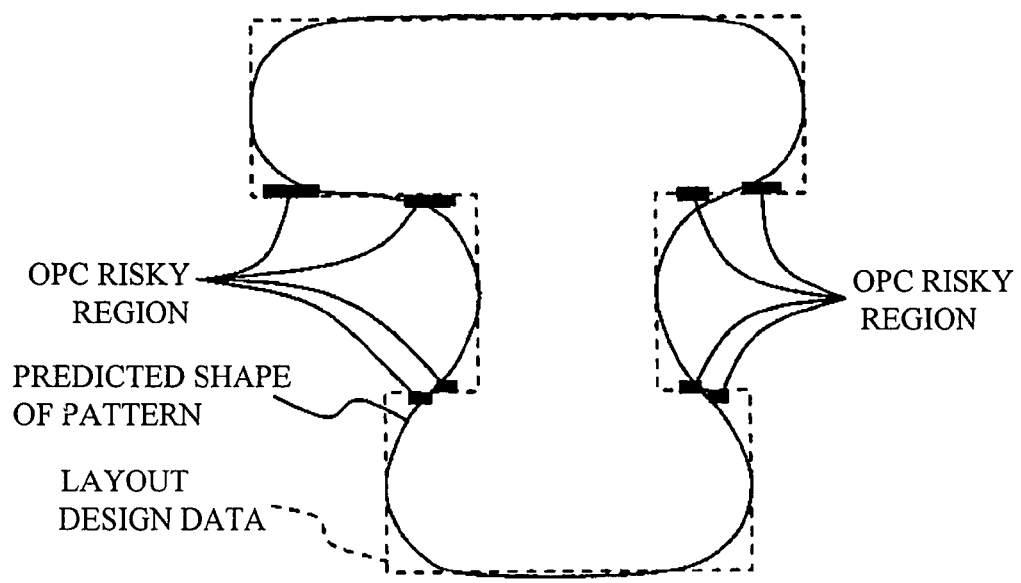
FIG. 14 is a schematic diagram showing an example of a state of extracting the OPC risky regions by superimposing a predicted shape of the pattern created by the OPC simulator included in the defect detecting system according to the embodiment of the present invention upon layout design data.

FIG. 14 is a schematic diagram showing an example of a state of extracting OPC risky regions by superimposing the predicted shape of the pattern upon the layout design data to compare the two.

The OPC simulator 414 moves the procedure to a step 460, at which the OPC simulator 414 transmits coordinate data on the extracted OPC risky regions to the OPC risky region database 504 and stores the coordinate data in the OPC risky region database 504, thus finishing the procedure. Graphical data on the pattern including the extracted OPC risky regions (closed graphic) may be stored in the OPC risky region database 504.

6. Functions and Advantages (6-1) Advantage Derived from Pre-detection of Critical Path According to the embodiment, the critical path, for which a sever accuracy is required for finishing of the pattern because of the requirement of high signal transmission accuracy for circuit operation, is extracted based on the circuit design data. The critical path is considered in the process of deciding portions to be inspected by the SEM defect review apparatus 300. This contributes to early detection of a new defect that may cause a malfunction although no contaminant adheres to the wafer and the wafer appears to be finished into a shape closer to that of the design data, in the manufacturing process.

For example, because of a crosstalk between parallel wirings, a microfabricated integrated circuit is influenced by electromagnetic induction, often resulting in degradation in signal quality. Furthermore, a wiring width (i.e., a wiring resistance) causes signal delay and adversely influences signal quality, operation reliability and the like. In case of a current highly microfabricated semiconductor circuit, it is difficult to determine whether a defect resulting from such an operational factor is a defect resulting from design or a defect resulting from the manufacturing process such as the exposure device and the exposure condition. It is increasingly difficult to detect such a defect even by the OPC simulation. It is estimated that this disadvantage becomes more conspicuous with the higher integration of the semiconductor progressing in the future.

The identification of to-be-inspected-portions in view of the critical path according to the embodiment is a new parameter for management points in the semiconductor process. Using the new parameter, there is every reason to expect that a defect which is conventionally detected for the first time by an operation test after manufacturing without being detected in the manufacturing process, can be detected.

(6-2) Advantage Derived from Narrowing Down of Defects

For example, if to-be-inspected portions detected by the optical defect detection and those detected by the OPC simulation are regarded as portions to be inspected by the SEM review apparatus, the number of portions to be inspected, naturally and considerably increases. In recent years, a detection rate of detecting fatal defects by the optical defect detection tends to be decreased with the higher integration of the semiconductor. Due to this, if detection sensitivity is improved so as to suppress a decrease in detection rate, then noise increases, and the number of incorrect portions to be inspected greatly increases. Moreover, out of the defects detected by the optical defect detection, low fatality portions can be filtered based on, for example, the comparison of the portions with the layout design data on the pattern. However, when portions to be inspected (fatal defects) are to be identified while relying on the pattern shape after exposure, high accuracy in identification of the portions to be inspected is not ensured.

According to the embodiment, by contrast, the defects extracted by the optical defect detection are narrowed down to extract fatal defects by the CAD filtering processing, and the fatal defects are further narrowed down to portions corresponding to the OPC risky regions. It is thereby possible to emphatically inspect portions the degree of importance of which is particularly high. Further, by separately inspecting the graphic corresponding to both the critical path and the OPC risky regions, a more appropriate inspection without error can be performed.

Actually, the portions corresponding to both the fatal defects and the OPC risky regions often overlap partly with those corresponding to both the critical path and the OPC risky regions. Due to this, even if the latter portions are added to portions to be inspected, the number of portions to be inspected does not excessively increase. It is eventually possible to extract minimum portions to be inspected having high necessity of inspection. It is, therefore, possible to optimize the portions to be inspected and improve measuring efficiency.

7. Modifications

The essential advantage of the present invention is that a defect which is conventionally detected for the first time by an operation test after manufacturing without being detected in the manufacturing process, can be detected in the manufacturing phase by the extraction of the critical path. As long as the essential advantage as described in (6-1) can be ensured, a combination of the condition that the portions to be inspected correspond to the OPC risky regions and the condition that the portions to be inspected correspond to the fatal defects is not limited to that described in the embodiment of the present invention when the SEM defect review apparatus 300 decides portions to be inspected.

Modifications of a method for causing the SEM defect review apparatus 300 to identify to-be-inspected portions using the critical path will now be described.

(7-1) First Modification

First, a method for simply identifying the critical path as the portion to be inspected by the SEM defect review apparatus 300 may be adopted. In this case, the fatal defects and the OPC risky regions are not always extracted. However, if an inspection is performed while greater importance is given to the critical path separately from an inspection in view of the fatal defects and the OPC risky regions, for example, the method is particularly effective.

(7-2) Second Modification

In the embodiment described above, the portions to be inspected are the graphics corresponding to both the critical path and the OPC risky regions, plus the portions corresponding to both the fatal defects and the OPC risky regions. Alternatively, only the former may be identified as the portions to be inspected. Namely, depending on the purpose of the inspection, it is effective to identify the graphics corresponding to both the critical path and the OPC risky regions as the portions to be inspected by the SEM defect review apparatus 300.

(7-3) Third Modification

Moreover, not the graphics corresponding to both the critical path and the OPC risky regions but graphics both corresponding to the critical path and including the fatal defects may be identified as the portions to be inspected. The fatal defects may be subjected to the CAD filtering processing or may not be subjected thereto. If such a method is used, it is possible to simply extract to-be-inspected portions in view of both the fatal defect portions of the pattern shape and the operating risky regions. Alternatively, not the portions corresponding to both the critical path and the OPC risky regions but regions or graphics corresponding to either the critical path or the OPC risky regions may be adopted as the portions to be inspected.

(7-4) Fourth Modification

In the embodiment described above, the portions to be inspected are the graphics corresponding to both the critical path and the OPC risky regions, plus the portions corresponding to both the fatal defects and the OPC risky regions. Alternatively, the graphics corresponding to the critical path, plus the portions corresponding to both the fatal defects and the OPC risky regions may be identified as the portions to be inspected. The fatal defects may be subjected to the CAD filtering processing in the extraction process or may not be subjected thereto.

(7-5) Fifth Modification

The portion described in (7-1) or those described in (7-3), plus the portions corresponding to both the fatal defects and the OPC risky regions may be identified as the portions to be inspected. The fatal defects may be subjected to the CAD filtering processing in the extraction process or may not be subjected thereto.

(7-6) Sixth Modification

A method for deciding portions corresponding to the critical path, including the OPC risky regions, and also corresponding to the fatal defects as the portions to be inspected by the SEM defect review apparatus 300 may be adopted. In this case, the number of portions to be inspected can be decreased to the minimum.

(7-7) Seventh Modification

A method for selectively deciding the to-be-inspected portions described in any one of (7-1) to (7-3) and the portions corresponding to both the fatal defects and the OPC risky regions as the portions to be inspected by the SEM defect review apparatus 300 may be adopted. The fatal defects may be subjected to the CAD filtering processing in the extraction process or may not be subjected thereto.

8. Others

The extraction of the fatal defects, the critical path, the OPC risky regions and the like and the extraction of graphic data of the extracted fatal defects, critical path, and OPC risky regions are not necessarily functions that the computer 400 is to include. Alternatively, the system may be configured so that the other calculating device can perform these processings. Namely, the system may be configured so that a part of or all of the CAD filter unit 411, the timing analyzer 412, the critical path extractor, the OPC simulator 414, the defect fatality analyzer 415, and the like are included in a calculating device other than the computer 400. For example, the system may be configured so that the control processors of the detecting apparatuses 100, 200, and 300 execute these controls.

Moreover, in each example stated above, an example of use of the information stored in the yield history database 507 is not particularly mentioned. However, if the SEM defect review apparatus 300 is to decide the portions to be inspected, then previous yield histories of semiconductor patterns of the same type may be read from the yield history database 507, and portions overlapping with the pattern of previous defect portions recorded in the yield histories may be preferentially extracted as the portions to be inspected.

Furthermore, the instance in which the predicted shape of the pattern by the simulation is compared with the layout design data (CAD data) on the pattern, and in which the portions where the distance between the predicted shape of the pattern and the profile line of the layout design data is equal to or larger than the threshold value are extracted as the OPC risky regions has been described. Alternatively, besides the configuration of selecting the OPC risky regions based on the determination made by the calculating unit 410 (or the OPC simulator 414), an operator may determine whether the portions are OPC risky regions while looking at a screen on which the predicted shape of the pattern and the layout design data are displayed with the predicted shape of the pattern superimposed on the layout design data. The same thing is true for an instance of extracting fatal defects by comparing the defects extracted by the optical defect detection with the layout design data.

What is claimed is:

1. A system for detecting a defect of a semiconductor in a semiconductor manufacturing process, comprising:
    a circuit design data storage unit for storing circuit design data;
    a layout design data storage unit for storing layout design data on a pattern;
    a timing analyzer for reading the circuit design data from the circuit design data storage unit, and extracting a critical path on a circuit in which a high accuracy is required for a signal transmission operation as compared with other portions;
    a critical path extractor for comparing the circuit design data read from the circuit design data storage unit with the layout design data read from the layout design data storage unit, and extracting graphical data including the critical path extracted by the timing analyzer;

a critical path storage unit for storing the graphical data including the critical path extracted by the critical path extractor;

an inspection recipe creator for deciding a to-be-inspected portion by a scanning electron microscope (SEM) defect review apparatus for acquiring an image of the defect on a wafer, based on coordinate information on the graphical data stored in the critical path storage unit and on coordinate information of a defect and creating a recipe based on the to-be-inspected portion.

2. The system for detecting a defect according to claim 1, further comprising an OPC risky region storage unit for storing an OPC risky region extracted by comparing a predicted pattern shape obtained by performing a light intensity simulation based on an OPC mask pattern, with the layout design data, wherein the inspection recipe creator decides a portion corresponding to both the graphical data including the critical path and the OPC risky region as the portion to be inspected, based on both information on the critical path read from the critical path storage unit and information on the OPC risky region read from the OPC risky region storage unit.

3. The system for detecting a defect according to claim 2, further comprising a fatal defect storage unit for storing information on a fatal defect extracted by comparing a defect image acquired by the SEM defect detecting apparatus with the layout design data read from the layout design data storage unit, wherein the inspection recipe creator adds the fatal defect read from the fatal defect storage unit to the portion to be inspected.

4. The system for detecting a defect according to claim 3, wherein the inspection recipe creator narrows down the fatal defect added to the portion to be inspected to the portion corresponding to the OPC risky region read from the OPC risky region storage unit.

5. The system for detecting a defect according to claim 3, further comprising:

an optical defect detecting apparatus for detecting a defect on the wafer by an optical defect detection; and a CAD filter unit for comparing the defect extracted by the optical defect detecting apparatus with the layout design data read from the layout design data storage unit, and narrowing down positions to an image acquisition position at which the SEM defect review apparatus acquires the image.

6. The system for detecting a defect according to claim 1, further comprising a fatal defect storage unit for storing information on a fatal defect extracted by comparing a defect image acquired by the SEM defect detecting apparatus with the layout design data read from the layout design data storage unit, wherein the inspection recipe creator decides a portion corresponding to both the graphical data including the critical path and the fatal defect as the portion to be inspected, based on both the information on the critical path read from the critical path storage unit and the information on the fatal defect read from the fatal defect storage unit.

7. The system for detecting a defect according to claim 6, further comprising an OPC risky region storage unit for storing an OPC risky region extracted by comparing a predicted pattern shape obtained by performing a light intensity simulation based on an OPC mask pattern, with the layout design data, wherein the inspection recipe creator adds a portion corresponding to both the OPC risky region and the fatal defect as the portion to be inspected, based on both the information on the OPC risky region read from the OPC risky region storage unit and the information on the fatal defect read from the fatal defect storage unit.

8. The system for detecting a defect according to claim 1, further comprising:

a fatal defect storage unit for storing information on a fatal defect extracted by comparing a defect image acquired by the SEM defect detecting apparatus with the layout design data read from the layout design data storage unit; and an OPC risky region storage unit for storing an OPC risky region extracted by comparing a predicted pattern shape obtained by performing a light intensity simulation based on an OPC mask pattern, with the layout design data, wherein the inspection recipe creator extracts a portion corresponding to both the OPC risky region and the fatal defect as other portion to be inspected, based on both the information on the OPC risky region read from the OPC risky region storage unit and the information on the fatal defect read from the fatal defect storage unit, and selects a portion to be inspected to be reviewed by the SEM defect review apparatus from both the portion to be inspected, based on the coordinate information on the graphical data stored in the critical path storage unit and the other portion to be inspected.

9. The system for detecting a defect according to claim 1, further comprising:

a fatal defect storage unit for storing information on a fatal defect extracted by comparing a defect image acquired by the SEM defect detecting apparatus with the layout design data read from the layout design data storage unit; and an OPC risky region storage unit for storing an OPC risky region extracted by comparing a predicted pattern shape obtained by performing a light intensity simulation based on an OPC mask pattern, with the layout design data, wherein the inspection recipe creator extracts a portion corresponding to both the graphical data including the critical path and the fatal defect as one portion to be inspected, based on both the information on the critical path read from the critical path storage unit and the information on the fatal defect read from the fatal defect storage unit, extracts a portion corresponding to both the OPC risky region and the fatal defect as other portion to be inspected, based on both the information on the OPC risky region read from the OPC risky region storage unit and the information on the fatal defect read from the fatal defect storage unit, and selects a portion to be inspected to be reviewed by the SEM defect review apparatus from the one portion to be inspected and the other portion to be inspected.

10. A method for detecting a defect of a semiconductor in a semiconductor manufacturing process, the method comprising automatically storing layout design data on a pattern;

reading, by a timing analyzer, the circuit design data from the circuit design data storage unit, and extracting a critical path on a circuit in which a high accuracy is required for a signal transmission operation as compared with other portions;

comparing, by a critical path extractor, the circuit design data read from the circuit design data storage unit with the layout design data read from the layout design data storage unit, and extracting graphical data including the critical path extracted by the timing analyzer;

storing, by a critical path storage unit, the graphical data including the critical path extracted by the critical path extractor;

deciding, by an inspection recipe creator, a to-be-inspected portion by a scanning electron microscope (SEM) defect review apparatus for acquiring an image of the defect on a wafer, based on coordinate information on the graphical data stored in the critical path storage unit and on coordinate information of a defect; and creating a recipe based on the to-be-inspected portion.

* * * * *